(12) United States Patent
Gerardo et al.

(10) Patent No.: US 10,674,622 B2
(45) Date of Patent: Jun. 2, 2020

(54) APERTURE SEAL STRUCTURE

(71) Applicant: Whelen Engineering Company, Inc., Chester, CT (US)

(72) Inventors: Tony Gerardo, Bristol, CT (US); Alexander A. Alonzo, Deep River, CT (US)

(73) Assignee: Whelen Engineering Company, Inc., Chester, CT (US)

( * ) Notice: Subject to any disclaimer, the term of this patent is extended or adjusted under 35 U.S.C. 154(b) by 0 days.

(21) Appl. No.: 16/105,538

(22) Filed: Aug. 20, 2018

(65) Prior Publication Data

US 2019/0059168 A1    Feb. 21, 2019

Related U.S. Application Data (60) Provisional application No. 62/547,137, filed on Aug. 18, 2017.

(51) Int. Cl.
*H05K 5/06* (2006.01)
*H05K 5/00* (2006.01)
(Continued)

(52) U.S. Cl.
CPC .............. *H05K 5/069* (2013.01); *F21S 43/14* (2018.01); *F21S 43/15* (2018.01); *F21S 43/19* (2018.01);
(Continued)

(58) Field of Classification Search
CPC ...... H05K 5/069; H05K 5/061; H05K 5/0008; H05K 5/0056; H05K 5/064; H05K 5/065;
(Continued)

(56) References Cited

U.S. PATENT DOCUMENTS

| 4,423,918 A | * | 1/1984 | Filreis | H02G 15/10 174/91 |
| 4,741,709 A | * | 5/1988 | Jervis | H01R 4/70 439/271 |

(Continued)

FOREIGN PATENT DOCUMENTS

WO    1993026070 A1    12/1993

OTHER PUBLICATIONS

International Search Report and Written Opinion dated Dec. 20, 2018 (PCT/US2018/047077).

(Continued)

*Primary Examiner* — Angel R Estrada
(74) *Attorney, Agent, or Firm* — Alix, Yale & Ristas, LLP (57) ABSTRACT

A seal structure includes a container, a sealant applied in liquid form that cures to a gel, and a cap that applies pressure to the gel. The container surrounds at least one opening in an assembly for the passage of elongated members such as wires. The container defines a chamber that is in communication with the opening and surrounds the wires passing through the opening. A closure spans the opening and is in contact with an inner end of the container. The chamber and the at least opening are partially filled with a predetermined quantity of sealant in liquid form, which cures into a viscous gel. The cap is configured to engage with the container and includes a platform that is positioned within the container and in contact with the gel sealant. In this arrangement, the cap applies positive pressure to the gel sealant.

12 Claims, 13 Drawing Sheets (51) Int. Cl.
*H05K 7/20* (2006.01)
*F21S 45/50* (2018.01)
*F21S 45/47* (2018.01)
*F21S 43/19* (2018.01)
*F21S 43/14* (2018.01)
*F21S 43/15* (2018.01)
*F21S 43/27* (2018.01)
*F21S 43/20* (2018.01)
*F21Y 115/10* (2016.01)

(52) U.S. Cl.
CPC .............. *F21S 43/26* (2018.01); *F21S 43/27* (2018.01); *F21S 45/47* (2018.01); *F21S 45/50* (2018.01); *H05K 5/0008* (2013.01); *H05K 5/0056* (2013.01); *H05K 5/064* (2013.01); *H05K 5/065* (2013.01); *H05K 7/2049* (2013.01); *H05K 7/20445* (2013.01); *F21Y 2115/10* (2016.08); *H05K 5/061* (2013.01)

(58) Field of Classification Search
CPC .... H05K 7/20445; H05K 7/2049; H05K 5/06; H05K 5/02; H05K 5/00; H05K 5/062; F21S 45/50; F21S 45/47; F21Y 2115/10; H01R 13/52; H01R 13/5205; H01R 13/521
USPC ........... 174/50.57, 50, 520, 50.52, 521, 539, 174/152 G, 135, 650, 148, 152 R, 155, 174/156; 361/600, 601, 641; 277/312, 277/314
See application file for complete search history.

(56) References Cited

U.S. PATENT DOCUMENTS

| | | | |
|---|---|---|---|
| 5,090,917 A | 2/1992 | Noorily et al. | |
| 5,777,268 A | 7/1998 | Allen et al. | |
| 7,164,193 B2 * | 1/2007 | Takahashi | H01L 31/105 174/50 |
| 7,688,596 B1 * | 3/2010 | Gardner | H01G 11/82 174/520 |
| 7,737,361 B2 * | 6/2010 | Huspeni | H01R 13/5216 174/74 R |
| 8,546,508 B2 | 10/2013 | Nabeta et al. | |
| 8,907,230 B2 * | 12/2014 | Chen | H02G 3/16 174/520 |
| 2009/0163086 A1 | 6/2009 | Janulis et al. | |

OTHER PUBLICATIONS

Information About Resin Designs Brand Connector Seal Grommets and Sealing Strips (2014).

* cited by examiner

APERTURE SEAL STRUCTURE

BACKGROUND

Electrical assemblies used in outdoor environments, such as outdoor sound, display, and light assemblies are exposed to environmental elements including sunlight, wind, rain, ice, salt, snow, mud, and the like. Internal components and electrical circuits of the electrical assemblies are susceptible to damage if not protected from exposure to the elements. Electronic assemblies that will be used outdoors or in other harsh environments are typically constructed to define a substantially sealed cavity to protect the internal components from the elements.

Electronic assemblies are also exposed to thermal cycles, such as during day and night use, sun and shade, summer and winter, and when powered on and off. Thermal cycles can change the pressure within the enclosure of the light assembly, and the resulting pressure cycles within the enclosure can draw and/or wick moisture past many types of existing seals and gaskets and into the enclosure. Moisture can be drawn into an otherwise sealed enclosure along the inside of a jacketed wire.

One common example of electronic assemblies that are routinely exposed to harsh environmental condition are light assemblies employed on emergency response vehicles and vehicles conducting roadside operations such as DOT and tow trucks. Electronic assemblies include a plurality of wires that penetrate the assembly housing to deliver control signals and/or power. The wires require a seal where they pass through the assembly housing so that moisture cannot reach sensitive components within the assembly. Prior art light assemblies may use methods of sealing such as threading each wire through holes in individual rubber grommets or potting with an epoxy encapsulant that flows around the wires and cures to a hardened state. The process of installing rubber grommets is slow, painstaking, and not easily automated. The epoxy encapsulant does not form a strong bond with, or adhere well to, the jacket of each wire. Further, hardened epoxy cannot move or flow in response to shifting of wires during installation or use. The prior art methods can allow water to pass through the housing inside of a jacketed wire.

There is a need for a seal structure and method that efficiently and effectively seal apertures through which conductors pass into electronic enclosures.

SUMMARY

According to aspects of the disclosure, embodiments of a disclosed seal structure comprise a container, a sealant applied in liquid form that cures to a gel, and a cap that applies pressure to the gel. In an illustrative embodiment, the container is secured to the housing of an electronic assembly surrounding an opening in the housing for elongated members such as wires. The container defines a chamber that is in communication with the opening and surrounds the wires passing through the opening. A PC board may span the opening and an inner end of the container to form a closure defining the inner end of the chamber. The chamber and the opening are partially filled with a predetermined quantity of sealant in liquid form, which is allowed to cure into a viscous gel. The container functions as a "potting dam" when receiving sealant in liquid form, and contains the sealant while it is allowed to cure. The cap is configured to engage with the container and includes a platform that is positioned within the container and in contact with the gel sealant. In this arrangement, the cap applies positive pressure to the gel sealant. Under pressure, the gel sealant forms a tight environmental seal that "self-heals" if conductors shift within the container and opening.

While in liquid form, the sealant coats the conductors and other surfaces of the opening and the interior of the container. In some assemblies, the opening is adjacent a location where the jacket of the conductors is removed and the conductor is crimped and/or soldered to establish an electrical connection. The electrical connection may be with a PC board or pins in a connector. Where the jacket of the conductor is removed, the liquid sealant flows into the spaces surrounding the wire and coats the end of the jacket. When the sealant is cured and later compressed within the container by the cap, the disclosed seal structure prevents movement of air and moisture into the enclosure along conductors inside of jacketed wires.

A method of sealing comprises providing a container and a cap. The container surrounds at least one opening in communication with the interior of a housing. The container defines a chamber that is in communication with the opening and surrounds wires passing through the opening. The container is secured to the housing in a manner that seals the container to an outside surface of the housing adjacent the opening. The wires are secured to a structure such as a PC board, with free ends of the wires passed through the opening in the housing and wire channels defined by the container. The PC board spans an inner end of the container and forms a closure opposite an outer end of the container. A predetermined quantity of curable liquid sealant is mixed, introduced into the chamber and opening, and cured to form a viscous gel. The cap has a platform which is positioned within the container and in contact with the cured sealant. The cap is secured to the container to maintain positive pressure on the cured sealant. The pressurized gel sealant provides a tight, self-healing environmental seal surrounding the wires.

BRIEF DESCRIPTION OF THE DRAWINGS

Aspects of the preferred embodiment will be described in reference to the drawings, where like numerals reflect like elements.

DETAILED DESCRIPTION

A first embodiment of a seal structure according to aspects of the disclosure will now be described with reference to FIGS. 1-13. The seal structure will generally be referred to by the reference numeral 10. Various materials, methods of construction, methods of manufacture, and methods of fastening will be discussed in the context of the disclosed embodiment. Those skilled in the art will recognize known substitutes for the materials, manufacturing methods, and fastening methods, all of which are contemplated as compatible with the disclosed embodiment and are intended to be encompassed by the appended claims.

The disclosed seal structure will generally be designated by reference numeral 10, and will be discussed in the context of exemplary light assemblies, but the seal structure is not limited to such use. The disclosed seal structure 10 may be used to seal an opening in the housing of any product or assembly through which an elongated structure extends from an interior to an exterior of the housing. The disclosed seal structure is not limited to use with electrical assemblies or light assemblies. The disclosed seal structure may alternatively be applied to connector assemblies or other couplings that require a sealed enclosure.

Figure 1:
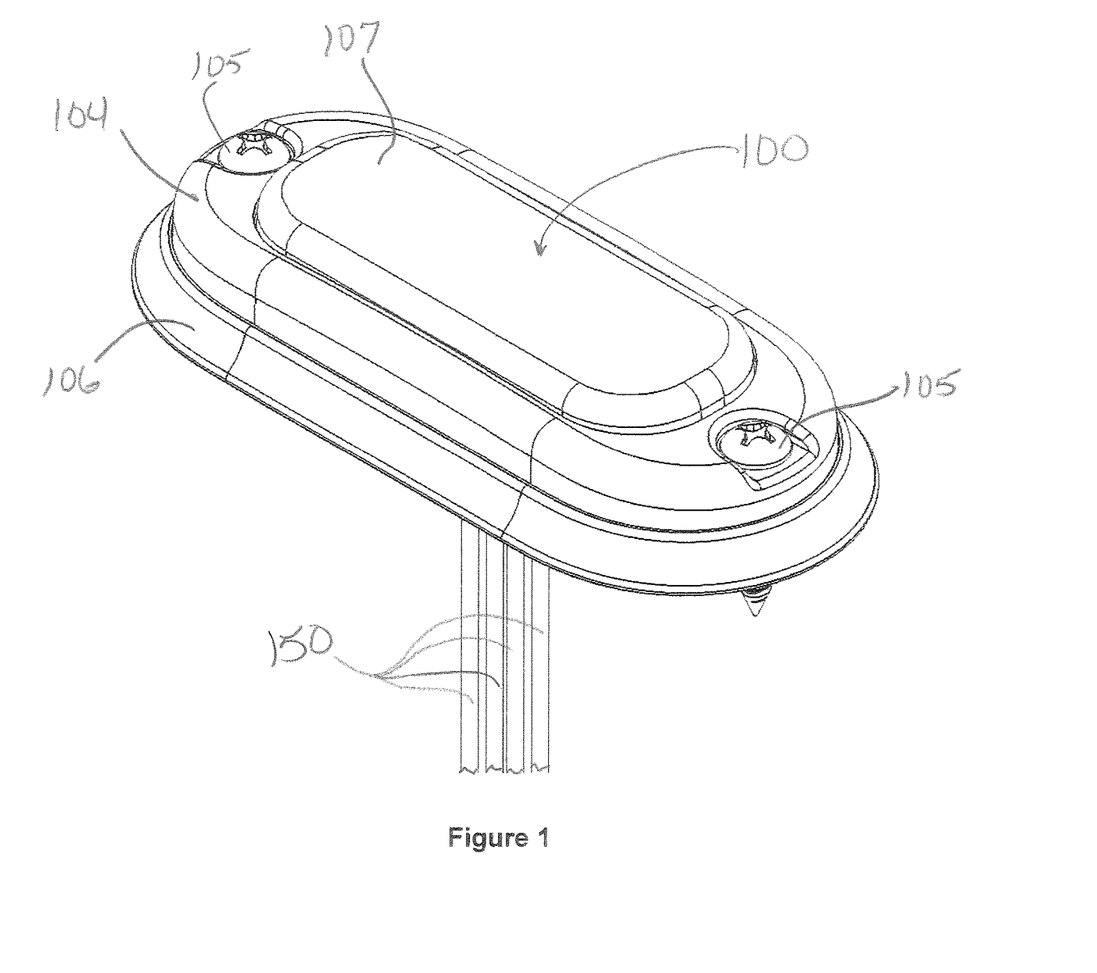
FIG. 1 is a front perspective view of a light assembly incorporating an aperture seal structure according to aspects of the disclosure.
Figure 2:
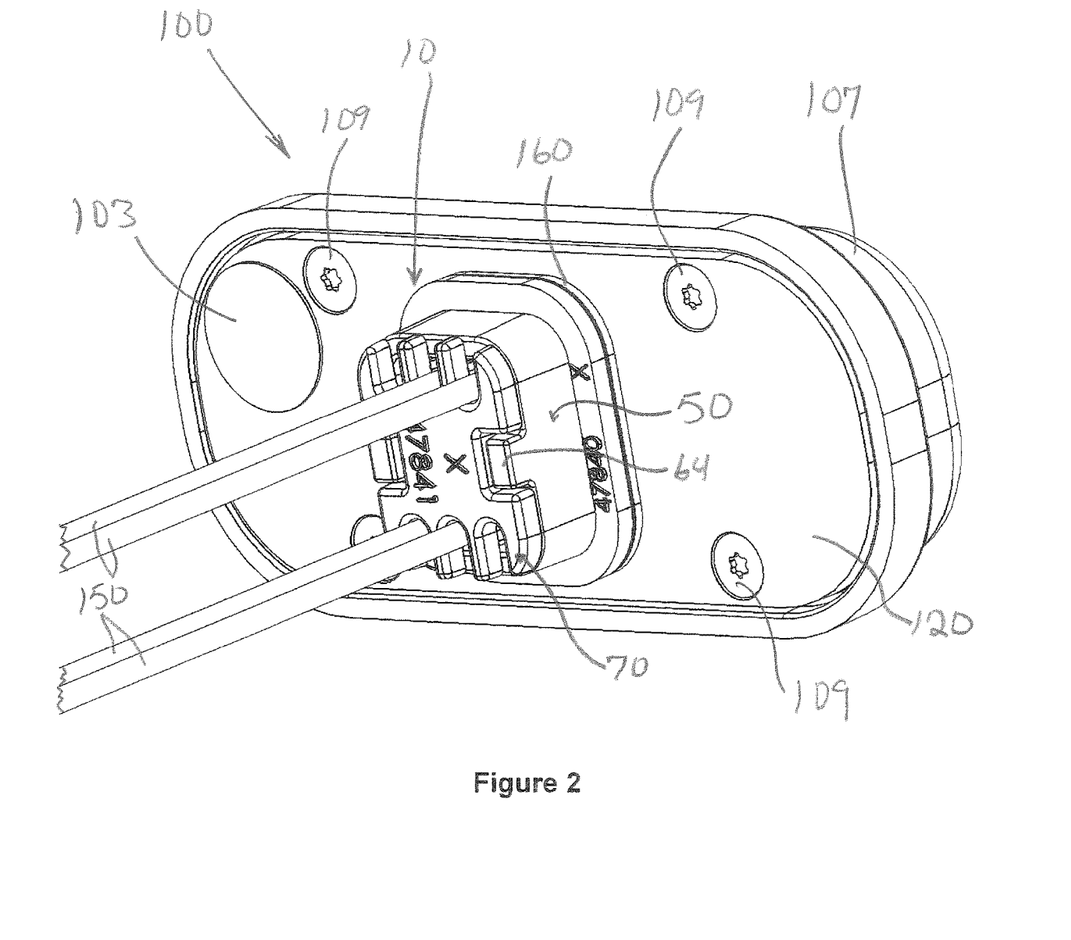
FIG. 2 is a rear perspective view of the light assembly and aperture seal structure of FIG. 1.
Figure 3:
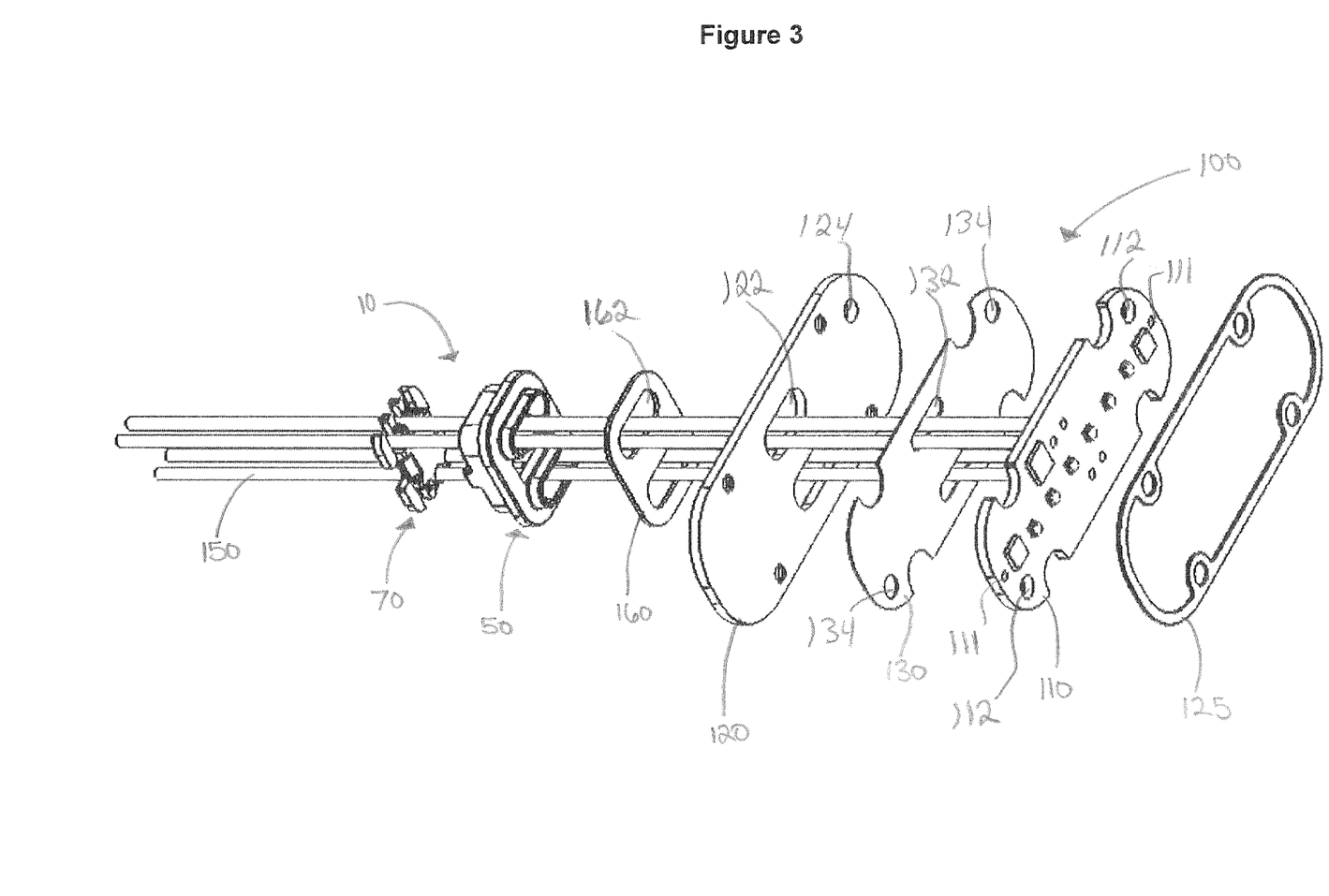
FIG. 3 is an exploded view of the aperture seal structure and adjacent components of the light assembly of FIG. 2.

In the context of the present disclosure, the disclosed seal structure 10 is associated with a light assembly as one example of an electrical assembly with which the disclosed seal structure 10 can be employed. As shown in FIGS. 1-3, in one disclosed embodiment, the electrical assembly is a light assembly 100 (hereafter "light 100"). FIG. 1 illustrates the light 100 surrounded by a bezel 104 through which fasteners 105 pass to secure the light 100 to a surface (not shown). Wires 150 pass through an opening in the mounting surface to connect the light 100 to power and control signals of a motor vehicle, as one example. A gasket 106 is arranged behind the light 100 and is trapped against the mounting surface by the bezel 104 as it is secured by the fasteners 105. The gasket 106 prevents water or other environmental contaminants from passing behind the light 100 and into an opening in the mounting surface through which the wires 150 pass. One example of a mounting surface may be a body panel of a vehicle used for emergency response or roadside operations.

FIG. 2 is a rear view of the light 100 without the bezel 104 or gasket 106, showing one embodiment of the disclosed seal structure 10 surrounding the wires 105 where they pass through the back of the light 100. A housing of the light 100 is formed from a dome-shaped lens 107 and a flat, sheet metal heat sink 120. Screws 109 pass through the heat sink 120 to engage screw bosses on the inside of the lens 107 to secure the heat sink 120 to the lens 107. FIG. 3 is an exploded view of the light 100 with the lens 107 and screws 109 omitted. The seal structure 10 includes a container 50 that is secured to an outside surface of the heat sink 120 by an adhesive 160 cut from a sheet or tape such as VHB tape manufactured by 3M. The adhesive 160 also forms a seal between the container 50 and the heat sink 120. The heat sink 120 and lens 107 define a housing that surrounds a printed circuit (PC) board 110 populated with LED lamps, circuit connections and electronic components. An adhesive seal 125 is compressed between a shoulder inside the lens 107 and the perimeter of the heat sink 120 to seal the lens 107 to the heat sink 120. The seal 125 surrounds the location where the screws 109 pass through the heat sink 120, sealing any potential leak path through the fastener openings in the heat sink 120.

The PC board 110 is configured to be received within the lens 107 inward of the seal 125. The top surface of the PC board 110 includes depressions or holes 111 that receive mating protrusions projecting from the inside of the lens 107 to define the location of the PC board 110 relative to optics on the lens 107. See FIG. 11 for detail of the inside surface of the lens 107. A thermally conductive gasket 130 such as CHO THERM manufactured by Parker Hannifin is disposed between the back side of the PC board 110 and the inside surface of the heat sink 120 to electrically insulate the PC board 110 from the heat sink 120, while forming a thermally conductive path for transmitting heat from the LEDs and electronic components on the PC board 110 to the heat sink 120. Screws 109 pass through the heat sink and engage screw bosses on the inside of the lens 107 (see FIG. 11) to secure the lens to the heat sink 120, compressing seal 125 and trapping the PC board 110 and thermally conductive gasket 130 tightly against the inside surface of the heat sink 120.

The heat sink 120 defines openings 122 and the thermally conductive gasket 130 defines openings 132 for the wires 150. The wires 150 have conductive metal strands 152 surrounded by an insulating jacket 154. The jacket 154 is removed to expose a length of the metal strands 152, which are secured to the PC board 110 by crimped and/or soldered connections as known in the art. The heat sink 120 also defines a hole 124 that is used to pressure test the assembled light 100. The thermally conductive gasket 130 defines two holes 134 and the PC board 110 defines two holes 112 in positions that ensure one of the holes will align with the hole 124 in the heat sink 120 when the light 100 is fully assembled. The aligned holes 124, 134 and 112 form an opening that communicates with the interior of the housing formed by the mated lens 107 and heat sink 120.

FIGS. 4-7 illustrate one disclosed embodiment of the container 50, which may be described as a "potting dam." In the disclosed embodiment, the container 50 is a molded plastic part, but other materials and methods of manufacture may be employed. The container 50 includes an inner end 51 shown best in FIGS. 4, 6 and 7, and an outer end 54 best seen in FIGS. 5 and 8. The inner end 51 of the container 50 includes a radially projecting lip 58 which has a planar surface 52 that is attached to the outside surface of the heat sink 120 by the adhesive gasket 160. The container inner end 51 includes two raised walls 57 projecting away from the lip 58 and surrounding oblong wire channels 56. The raised walls 57 have a slightly tapered shape and are configured to be closely received in the openings 122 defined by the heat sink 120. The raised walls 57 extend from the planar surface 52 a distance slightly less than the thickness of the heat sink 120 and adhesive gasket 160, which defines openings 162 for the raised walls 57. The raised walls 57 act as an electrical insulator to prevent any contact between the wires 150 and the edges of the openings 122 in the metal heat sink 120. The raised walls also prevent lateral movement of the container relative to the heat sink 120.

Figure 6:
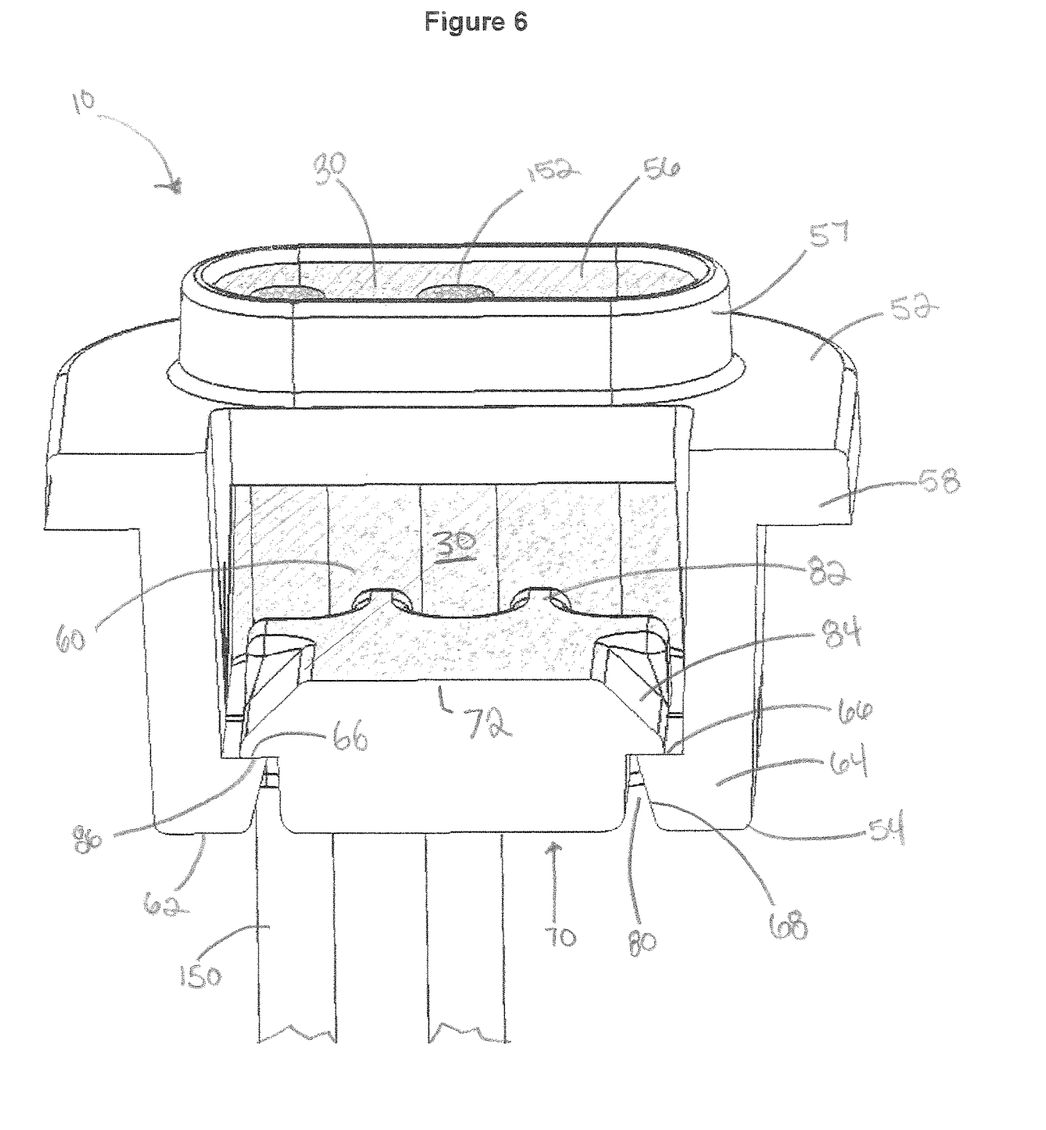
FIG. 6 is a sectional view of the aperture seal structure cap, wires and sealant of FIGS. 1-5.
Figure 8:
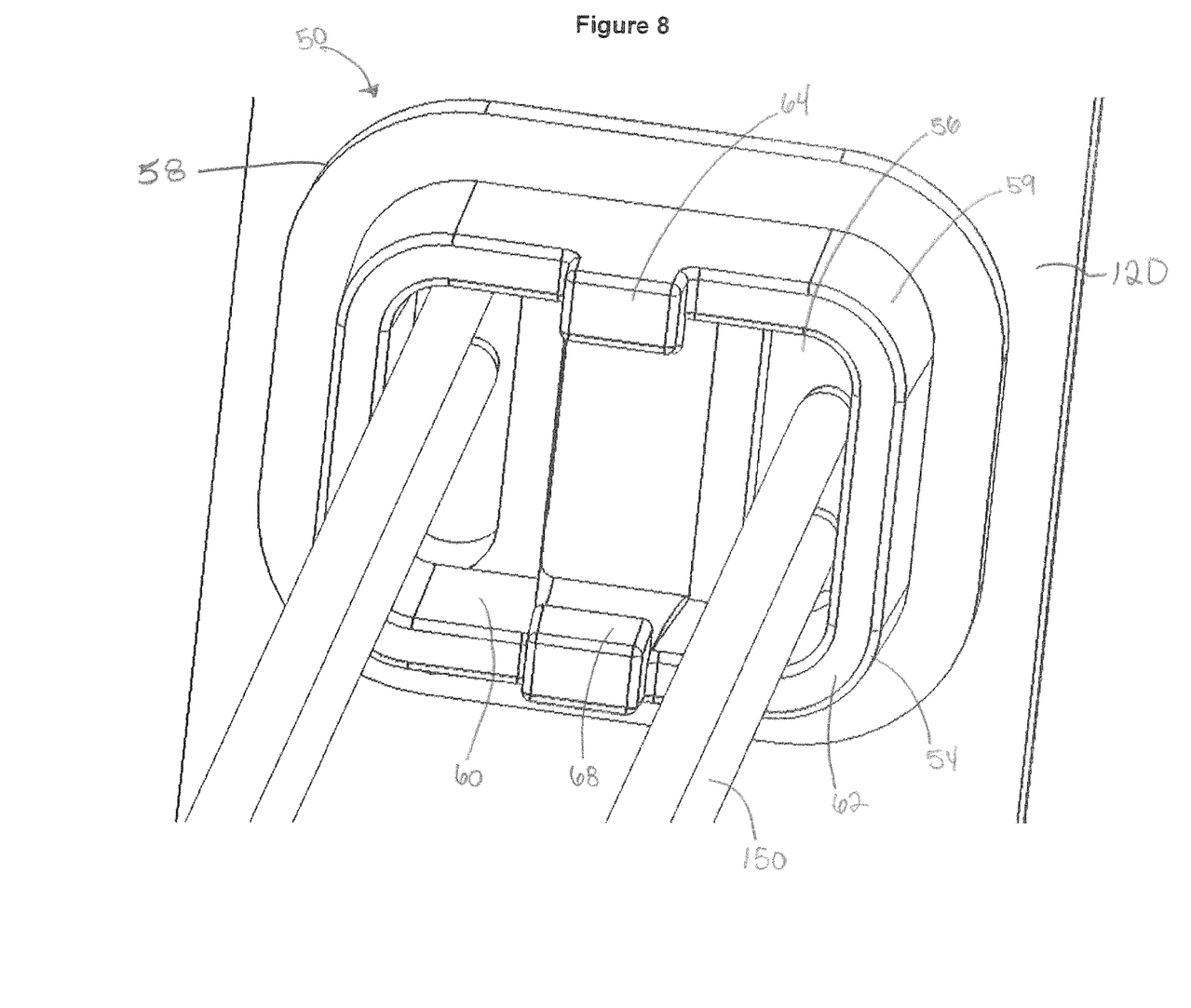
FIG. 8 is a perspective view of the container of the aperture seal structure and the light assembly of FIG. 1-7, mounted to the light assembly surrounding wires before filling with liquid sealant.

Side walls 59 extend between the radial lip 58 and the outer end 54 from the outer end 54 of the container 50 and define a chamber 60 which communicates with the wire channels 56 as best shown in FIG. 8. The side walls 59 terminate at an outer rim 62 at the outer end 54 of the container 50. A catch 64 projects above opposed sides of the rim 62 between the wire channels 56. Each of the two catches 64 includes an inwardly projecting shoulder 66 having a sloped inner surface 68. Each catch 64 is configured to mate with complementary features on the cap 70, as shown in FIG. 6. The container 50 includes an opening 53 between the raised walls 57. The opening 53 is needed to provide access for injection mold structure for the inward projecting shoulder 66 of the catch without moving parts in the mold. The opening 53 is spanned by the adhesive gasket 160 when the container 50 is mounted to the heat sink 120, and plays no role in the function of the disclosed seal structure 10.

Figure 4:
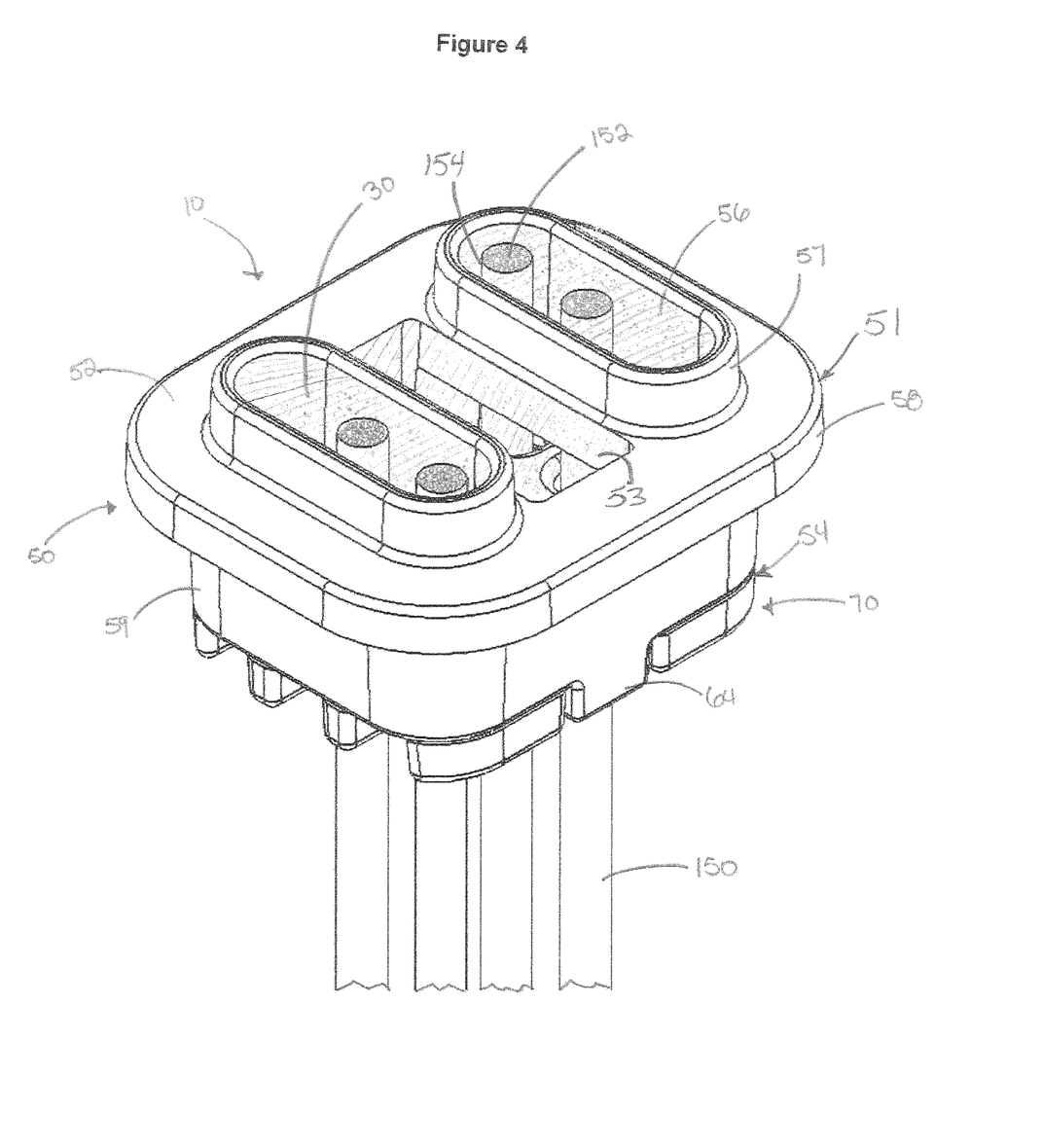
FIG. 4 is a rear perspective view of the aperture seal structure and wires from the light assembly of FIG. 2.
Figure 5:
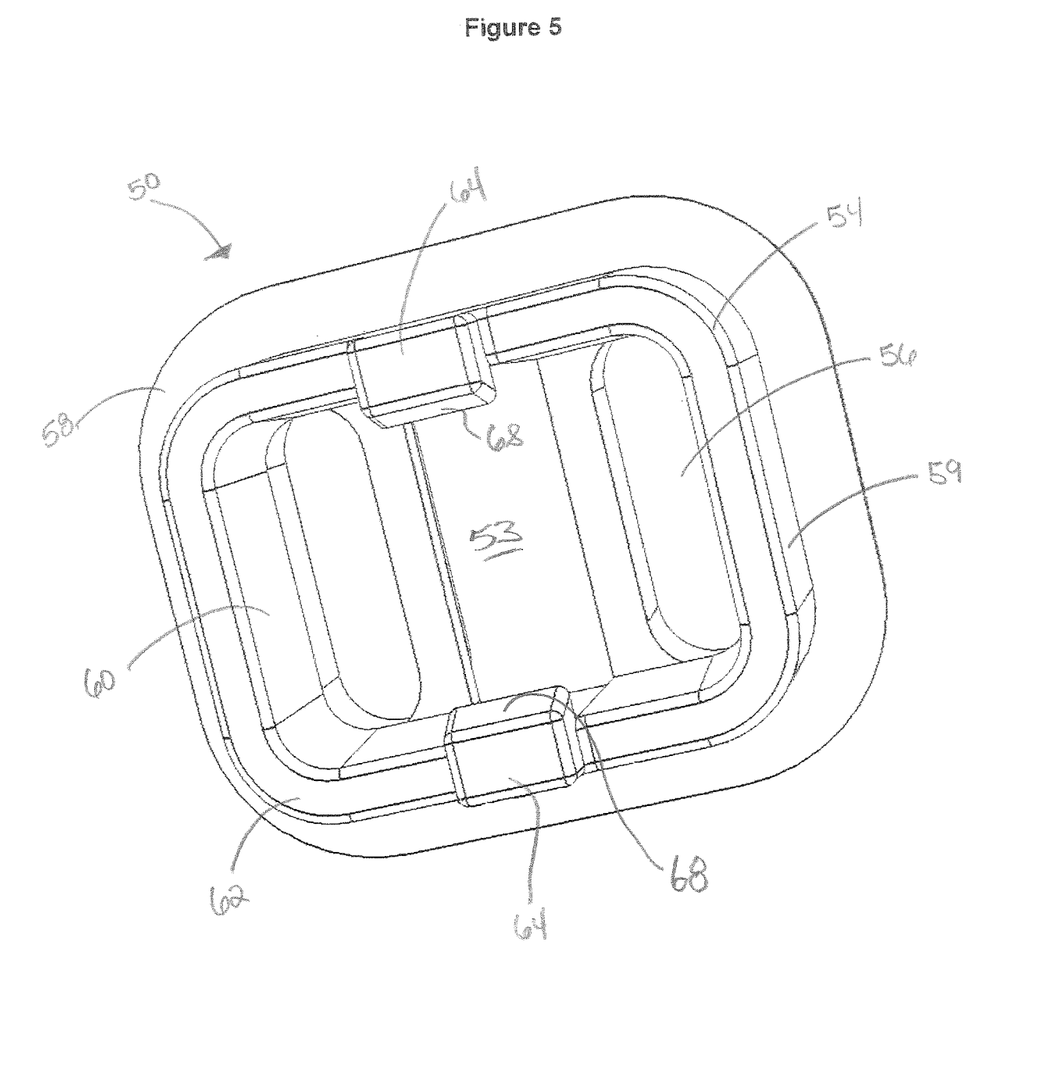
FIG. 5 is a perspective view of the outer end a container from the seal structure of FIG. 2, with the cap removed.
Figure 7:
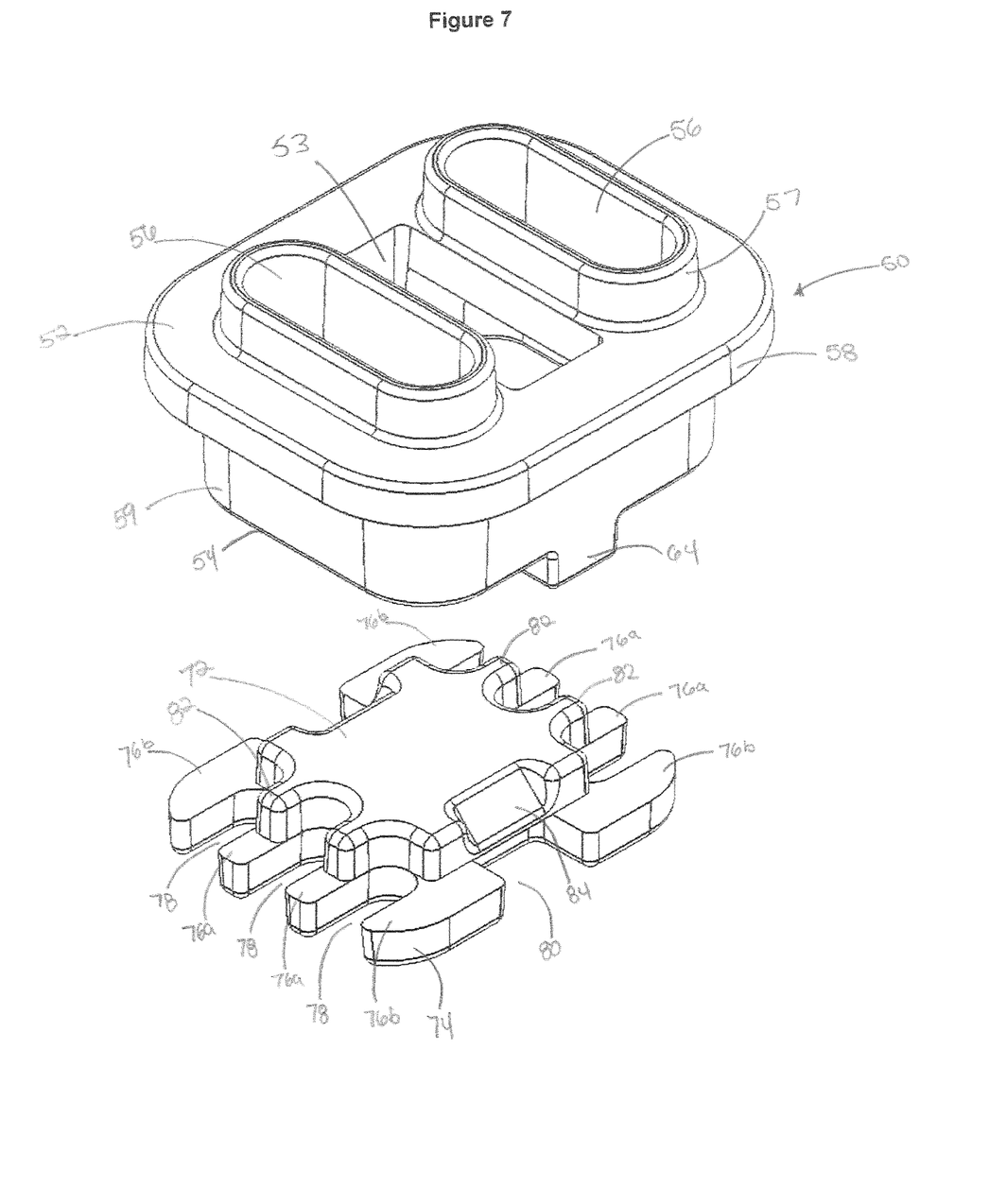
FIG. 7 is an exploded perspective view of the container and cap of the aperture seal structure of FIGS. 1-6.

As shown in FIGS. 4, 6, and 7, the cap 70 is configured to mate with the container 50. The cap 70 includes an inwardly facing platform 72 projecting from an outer plate 74. The cap 70 has side surfaces oriented to correspond with the first and second sides of the container 50, as shown in FIGS. 2 and 4. The outer plate 74 includes a plurality of fingers 76a, 76b in side-by-side arrangement that define U-shaped recesses 78 to receive wires 150. In the disclosed embodiment, the cap 70 defines a total of six U-shaped recesses 78 for wires 150, but more or fewer recesses are compatible with the disclosed seal structure 10. The plurality of fingers 76a, 76b extend from opposing sides of the cap 70 in axial alignment with the position of the wire channels 56. In the disclosed embodiment, there are two inner fingers 76a and two outer fingers 76b on each opposing side. The U-shaped recesses 78 are defined between adjacent inner and outer fingers 76a/76b or between adjacent inner fingers 76a/76a for receiving wires 150. A notch 80 is defined on opposite sides of the cap 70 in axial alignment with the position of each catch 64. Each notch 80 is configured to receive a catch 64 projecting from the rim 62 of the container 50 in a snap-fit arrangement to secure the cap 70 to the container.

The platform 72 includes a pair of ribs 82 on opposing sides which overlap the inner fingers 76a. A ramp 84 is defined on opposing sides above the notch 80 and between the outer fingers 76b. Each ramp 84 is configured to cooperate with complementary sloped inner surfaces 68 of the catches 64 to guide outward movement of the catches 64 during installation of the cap 70 to the container 50. A base portion of each ramp 64 includes a ledge 86 that hangs over each slot 80 for abutting the shoulder 66 of each catch 64 and forming a snap-fit engagement of the cap 70 and the container 50.

Figure 9:
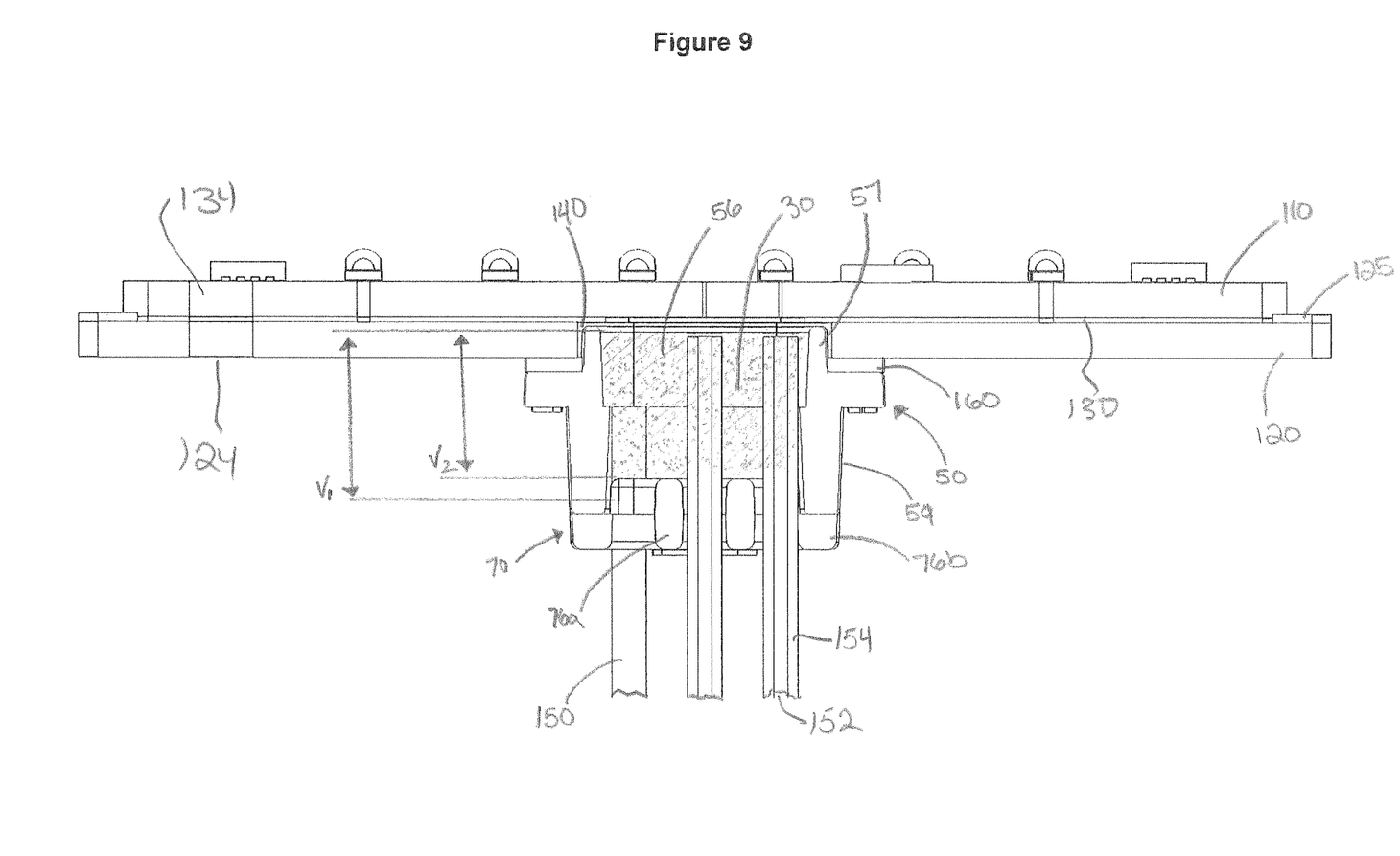
FIG. 9 is a cross-sectional view of the disclosed aperture seal structure, heat sink and PC board of the light assembly of FIGS. 1-8, with the other components of the light assembly omitted.
Figure 10:
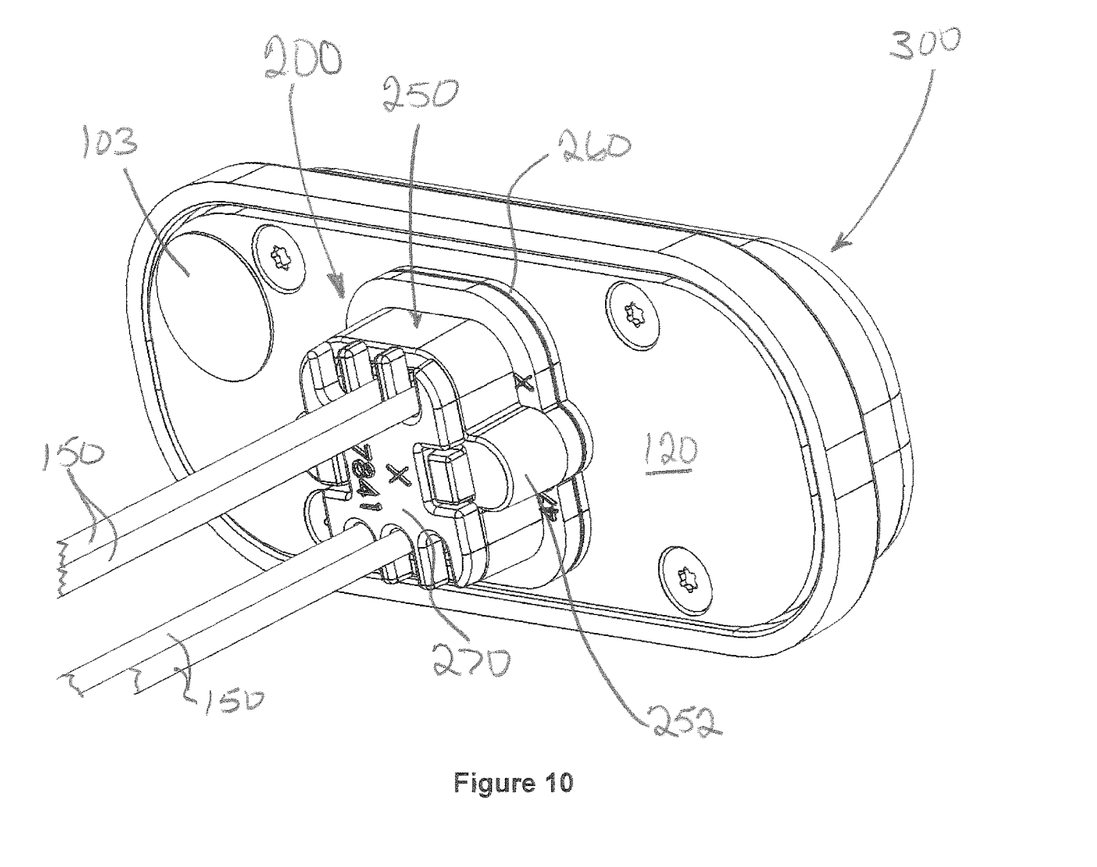
FIG. 10 is a rear perspective view of a second light assembly and alternative embodiment of an aperture seal structure according to aspects of the disclosure.

As shown in FIGS. 2, 8 and 9, the container 50 is attached to the heat sink 120 with by the adhesive gasket 160 to form a potting dam sealed to the heat sink 120 and surrounding the openings 122 in the heat sink 120. Wires 150 extend through the chamber 60 of the container 50, wire channels 56, and the wire openings 122 in the heat sink 120 and 132 in the thermally conductive gasket 130 to the PC board 110. In the disclosed embodiment, the thermally conductive gasket 130 and PC board 110 form an inner closure of the chamber 60 defined by the container 50. An inner closure allows the chamber to be filled with a sealant 30 in liquid form. According to aspects of the disclosure, a two-part sealant 30 is mixed to form a low temperature curing, viscous liquid. In the disclosed embodiment, the sealant 30 has a viscosity of at least 10,000 cP and a cure time preferably less than one hour. In a preferred embodiment, the sealant 30 cures in approximately 30 minutes. A pre-determined quantity of the liquid sealant 30 is introduced to the chamber 60 of the container 50. The liquid sealant 30 coats surfaces and fills gaps within the chamber 60, each wire channel 56, around the jackets 154 of the wires 150, and between the stranded conductors 152 of the wires 150 in areas where the stranded conductors 152 are exposed at the connection with the PC board 110. The quantity of sealant 30 is measured to fill the chamber 60 to a level that will be compressed by the platform 72 of the cap 70 when the cap 70 is attached to the container 50. The quantity of sealant 30 is dependent upon the number of wires 150 passing through the seal structure 10, with each wire occupying a defined portion of the chamber and reducing the volume to be filled by the sealant 30.

The sealant 30 is allowed time to cure and forms a self-healing, re-enterable, viscous gel. The cap 70 is positioned proximate the rim 62 of the container 50 with each ramp 84 aligned with the sloped surfaces 68 of each catch 64. The cap 70 is pressed into the container 50, with the ramps 84 and sloped surfaces 68 cooperating to move the catches 64 outwardly until the shoulder 66 of the catch 64 moves past the outer end of the ramp 84 and snaps inwardly to overlap with the ledge 86, as shown in FIG. 6. As the cap 70 is advanced toward the container 50 during installation, the platform 72 of the cap 70 comes into contact with the cured sealant 30 and applies a positive pressure on the cured sealant 30. Under pressure from the cap 70, some sealant 30 will flow into the U-shaped recesses 78 and surround the wires 150 where they emerge from the disclosed seal structure 10. In the disclosed embodiment, the platform 72 of the cap, in combination with a pre-determined quantity of sealant 30, results in positive pressure of at least 5 psi applied the cured sealant 30. Under pressure, the sealant 30 will flow around the wires 150 as they are moved during handling and installation in a manner that more rigid, epoxy based sealants cannot. Application of positive pressure by the sealant 30 on the wires 150 acts as a physical barrier to moisture which otherwise could wick along the inside of the jacket 154 of each wire 150 and into the housing of the light 100. The platform 72 changes the volume available for the sealant 30 in the container 50 from a first volume $V_1$ to a second volume $V_2$. In the disclosed embodiment, the platform 72 decreases the volume available for the sealant 30 in the container 50 by at least 5%.

According to aspects of the disclosure, the container 50 is secured to the heat sink 120 to form a sub-assembly. The wires 150 are stripped and joined to the PC board 110 by crimped and/or soldered connections to form a further subassembly. The thermally conductive gasket 130 is placed between the back side of the PC board 110 and the inside surface of the heat sink 120, and fasteners 109 are driven into the screw bosses of the lens 107 to connect the lens 107 to the heat sink 120 with the PC board 110 compressed against the thermally conductive gasket 130 and heat sink 120. A pre-determined quantity of sealant 30 in liquid form is poured into the chamber 60 of the container 50, where it coats all surfaces and fills cracks and voids, including at the juncture of the stranded conductors 152 and wire jacket 154 adjacent the PC board 110. The sealant 30 is allowed to cure. In the disclosed embodiment, the sealant 30 cures to a viscous gel in approximately 30 minutes at room temperature. The cap 70 is snapped onto the container 50, with the fingers 76a separating the wires 150 and the platform 72 of the cap 70 applying pressure to the sealant 30. The cured sealant 30 will flow under pressure and fill any voids between the wires 150 and the cap 70 and between the cap 70 and the container 50. The light 100 is then pressure tested according to known methods at opening 124 in the heat sink 120. Lights that exhibit leakage are rejected. A vent 103 is applied to cover the opening 124 of lights that pass the pressure test. The vent 103 equalizes pressure between the inside of the light 100 and the ambient environment, while preventing the intrusion of moisture and other contaminants. The vent 103 may be a GORE protective vent from W.L. Gore & Associates, Inc.

Assembly steps for the light 100 incorporating the disclosed seal structure 10 include:

Securing the container to a housing—in the disclosed light assembly 100 and seal structure 10, this means preparing the container 50 and heat sink 120 surfaces, positioning the adhesive gasket 160 between the container 50 and the heat sink 120 and applying pressure to secure the container 50 to the heat sink 120;

Stripping the wire jacket 154 to expose stranded conductors 152 and connecting the wires 150 to the PC board by crimped and/or soldered connections;

Positioning a thermally conductive gasket 130 between the PC board 110 and an inside surface of the heat sink 120 and routing free ends of the wires 150 through the wire channels 56 and chamber 60 of the container 50;

Arranging a seal between the lens 107 and the heat sink 120;

Securing the lens 107 to the heat sink 120 with the PC board 110 compressed against the thermally conductive gasket 130 and heat sink 110;

Filling the chamber 60 of the container 50 with a predetermined volume of sealant 30 in liquid form;

Allowing the sealant 30 to cure to form a viscous gel;

Aligning the cap 70 with the container 50 with wires 150 in the U-shaped recesses 78, Advancing the cap 70 toward the container 50 to engage the catches 64 on the container 50 with the ledges 86 on the cap to lock the cap 70 to the container 50 in a defined position in which the platform 72 of the cap 70 applies pressure to the viscous gel sealant 30;

Pressure testing the electronic assembly at opening 124 to determine whether the enclosure is sealed, where assemblies that leak are rejected; and Applying a vent 103 spanning the opening 124 to allow equalization of pressure in the enclosure, but preventing the intrusion of moisture or other contaminants.

Figure 11:
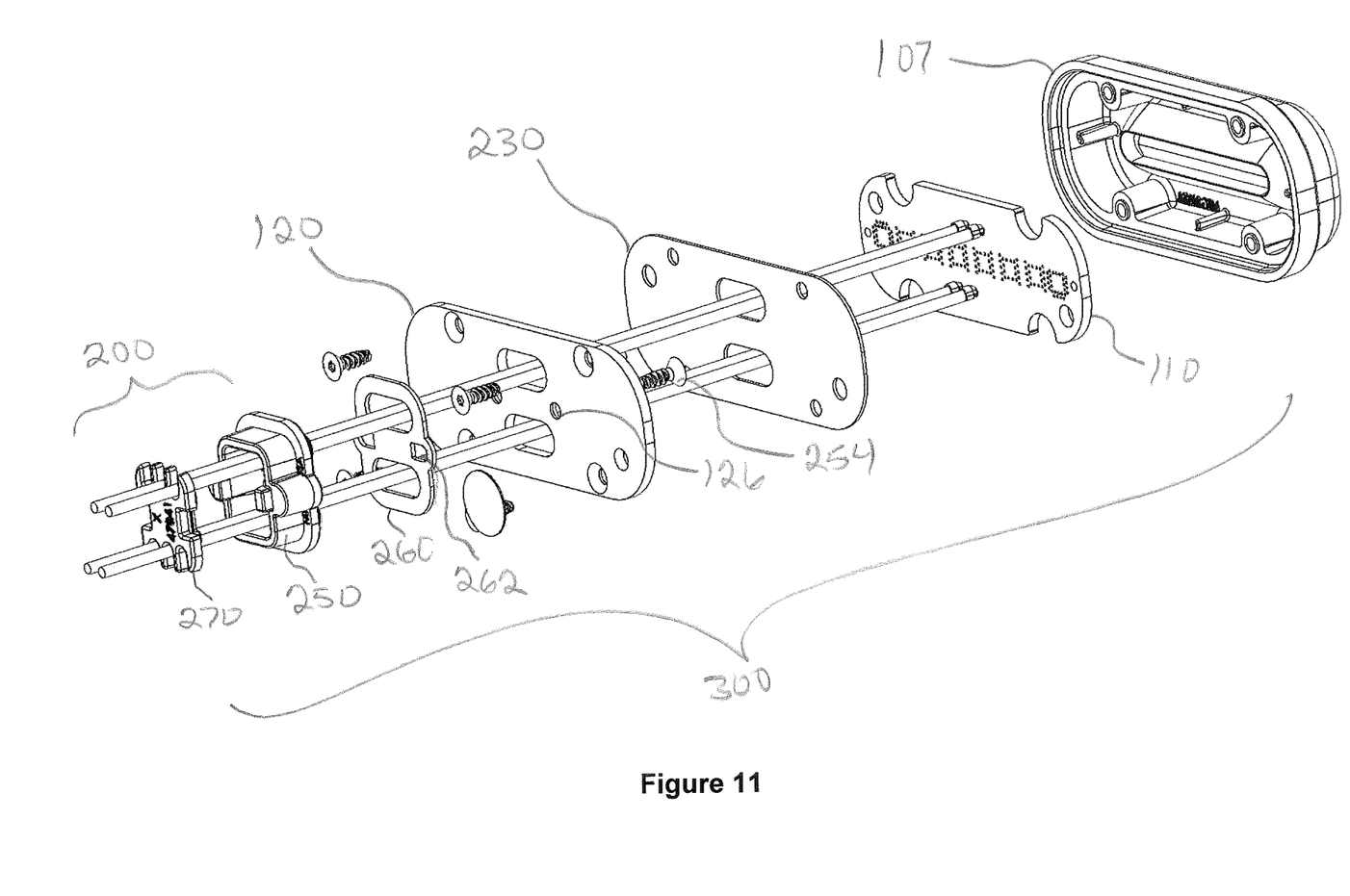
FIG. 11 is a rear exploded view of the light assembly and aperture seal structure of FIG. 10.

FIGS. 10-13 illustrate an alternative embodiment of a seal structure 200 according to aspects of the disclosure. Seal structure 200 will be described only to the extent that it differs from seal structure 10 in terms of its configuration and the steps necessary to connect the seal structure 200 to a light 300. In all other respects, the seal structure 200 functions identically to the seal structure 10 of FIGS. 1-9. FIG. 11 is an exploded diagram of the light 300, showing the seal structure 200, adhesive gasket 260, heat sink 120, thermally conductive gasket 230, PC board 110 and lens 107. The gaskets 260 and 230 of light 300 have a different configuration than shown in the light 100 of FIGS. 1-9. Gasket 260 is shaped to extend beneath the screw bosses 252 and includes openings 262. Thermally conductive gasket 230 is laterally extended to form a seal between the heat sink 120 and the inside shoulder of the lens 107, eliminating the separate adhesive gasket 125 of the light 100.

Figure 12:
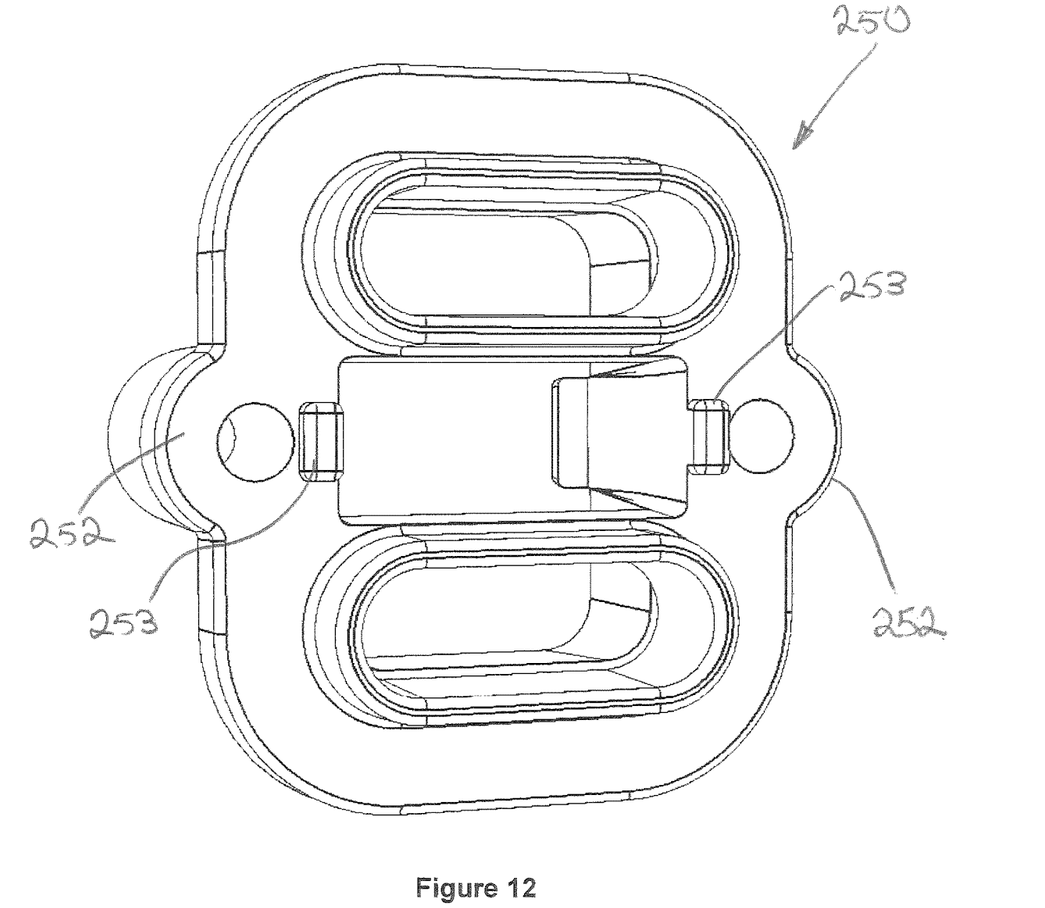
FIG. 12 is an enlarged perspective view of the inner end of a container of the aperture seal structure of FIGS. 10 and 11.
Figure 13:
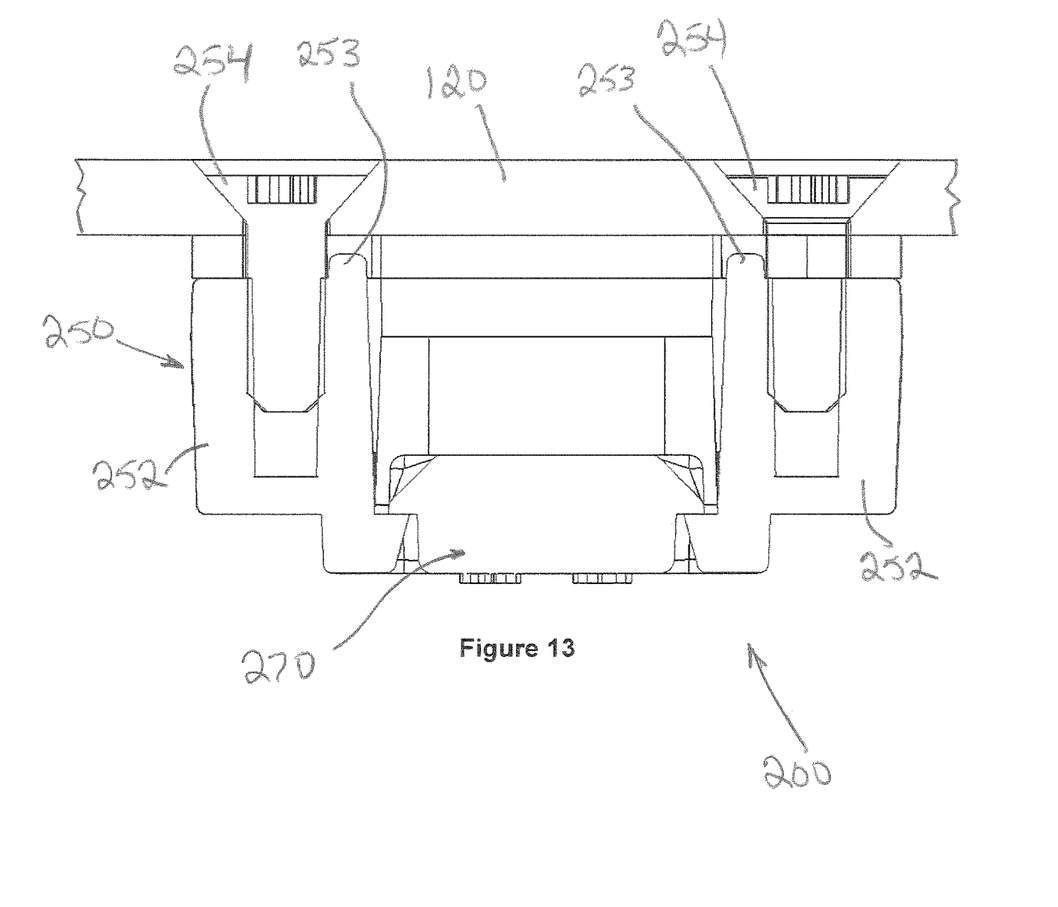
FIG. 13 is a sectional view of the aperture seal structure of FIGS. 10-12 mounted to a heat sink of the light assembly with other components omitted.

The seal structure 200 of FIGS. 10-13 modifies the container 250 to add screw bosses 252 and protrusions 253 (best seen in FIGS. 12 and 13. The screws 254 extend through the heat sink 120 from the inside and engage the screw bosses 252 to secure the container 250 against the outside surface of the heat sink 120 to enhance a mechanical connection between the container 250 and the heat sink 120. The protrusions 253 bear against the outside of the heat sink 120 adjacent the screw bosses 252 and act as stops during the tightening of the fasteners 254 to control the amount that the adhesive gasket 260 is compressed. The openings 262 in the adhesive gasket 260 allow the screws 254 to pass through the gasket 260 and allow the protrusions to bear directly against the heat sink 120. Connection of the container 250 to the heat sink 120 includes the step of driving screws 254 through openings 126 in the heat sink to pull the protrusions 253 into contact with the outside surface of the heat sink 120. FIG. 13 is a sectional view of the heat sink 120, gasket 160 and aperture structure 200 during the process of tightening screws 254, where the protrusions 253 are not yet in contact with the heat sink 120. Screws 254 are used to illustrate fastening the container 250 to the heat sink 120, other fasteners can be used.

Although representative embodiments of the disclosed aperture seal structure described herein have been disclosed in the context of certain illustrative, non-limiting embodiments, it should be understood that various changes, substitutions, permutations and alterations may be made to these embodiments without departing from the broader scope of the invention as set forth in the claims. It is also understood that the aperture seal structure is not limited to the disclosed embodiments and that structural and mechanical alterations may be made by those skilled in the art that fall within the scope of the invention as defined by the claims.

What is claimed:

1. A seal structure comprising:
    a container surrounding at least one channel communicating with a housing, said container defining a chamber in communication with the at least one channel;
    the chamber and the at least one channel are partially filled with a predetermined quantity of gel sealant;
    a cap having a platform positioned within the container and in contact with the gel sealant,
    wherein, said cap applies positive pressure to said gel sealant.

2. The seal structure of claim 1, wherein the container includes a pair of catches configured to mate with a complementary pair of ramps included on the cap, said container and cap forming a snap-fit connection.

3. The seal structure of claim 1, wherein the cap includes a plurality of fingers in axial alignment with the at least one channel.

4. The seal structure of claim 1, wherein the at least one channel is defined by a raised wall projecting from the container.

5. The seal structure of claim 1, wherein jacketed wires having stranded conductors extend through the at least one channel and said sealant fills spaces between the stranded conductors at an end of each wire.

6. The seal structure of claim 5, wherein the gel sealant applies a positive pressure on the outside of the jacketed wires and said positive pressure acts as a physical barrier to moisture.

7. A method of sealing comprising:
    providing a container surrounding at least one channel communicating with a housing, said container defining a chamber in communication with the at least one channel;
    mixing a predetermined quantity of curable liquid sealant;

introducing said liquid sealant into said chamber and at least one channel;
curing said liquid sealant to a gel sealant;
providing a cap having a platform positioned within the container and in contact with the cured sealant;
securing said cap to the container,
wherein, curing said liquid sealant to a gel sealant forms a seal within the chamber and the at least one channel.

8. The method of sealing of claim 7, wherein the step providing a cap includes the cap having a plurality of fingers defining U-shaped recesses.

9. The method of sealing of claim 7, wherein the steps of providing a container and a cap comprise the container including a pair of catches configured to mate with a pair of ramps included on the cap, said container and cap forming a snap-fit connection.

10. The method of sealing of claim 7, wherein the step of curing the sealant includes the sealant having a viscosity of at least 10,000 cP.

11. The method of sealing of claim 7, wherein the step of providing a cap includes the cap applying a positive pressure on the cured sealant and the cured sealant applying a positive pressure on the outside of jacketed wires extending through the at least one channel.

12. The method of sealing of claim 11, wherein the step of providing a cap includes the positive pressure of the cured sealant on the outside of the wires acting as a physical barrier to moisture.

* * * * *